(12) United States Patent
Zhong et al.

(10) Patent No.: US 6,995,465 B2
(45) Date of Patent: Feb. 7, 2006

(54) SILICON BUILDING BLOCK ARCHITECTURE WITH FLEX TAPE

(75) Inventors: Dong Zhong, Chandler, AZ (US); Yuan-Liang Li, Chandler, AZ (US); Jiangqi He, Chandler, AZ (US); Jung Kang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 71 days.

(21) Appl. No.: 10/455,908

(22) Filed: Jun. 4, 2003

(65) Prior Publication Data

US 2004/0245545 A1   Dec. 9, 2004

(51) Int. Cl.
*H01L 23/48* (2006.01)

(52) U.S. Cl. ...................................... 257/692; 257/700

(58) Field of Classification Search ..................... None
See application file for complete search history.

(56) References Cited

U.S. PATENT DOCUMENTS

| | | | |
|---|---|---|---|
| 5,854,534 A * | 12/1998 | Beilin et al. ................ | 257/691 |
| 5,885,710 A * | 3/1999 | MacDonald et al. ........ | 428/375 |
| 6,239,485 B1 * | 5/2001 | Peters et al. ................ | 257/700 |
| 6,770,822 B2 * | 8/2004 | Pasternak et al. ........... | 174/260 |
| 6,791,403 B1 * | 9/2004 | Tayrani et al. .............. | 327/565 |

\* cited by examiner

*Primary Examiner*—Douglas A. Wille
(74) *Attorney, Agent, or Firm*—Schwabe, Williamson & Wyatt, P.C.

(57) ABSTRACT

An apparatus is constituted with an integrated circuit and a flex tape coupled to the integrated circuit. The flex tape is employed to facilitate ingress/egress of signals to/from the integrated circuit. In one embodiment, the flex tape includes a plurality of signal traces. In another embodiment, the apparatus also includes a silicon interposer coupled to the flex tape and a substrate coupled to the silicon interposer.

10 Claims, 17 Drawing Sheets

SILICON BUILDING BLOCK ARCHITECTURE WITH FLEX TAPE

FIELD OF THE INVENTION

The present invention relates generally to the field of integrated circuit packaging. Specifically, this invention relates to the efficient power and signal delivery associated with integrated circuit packaging.

BACKGROUND OF THE INVENTION

Advances in the technology surrounding today's integrated circuits designs, such as microprocessors, continue at an astounding rate. As a result of these advances, integrated circuits are more dense and faster than ever. Moreover, integrated circuits have input/output (I/O) which are operating at higher frequencies than ever. In addition, integrated circuits are consuming more power than their predecessors. These factors are bringing about new challenges for packaging engineers.

On the issue of power consumption, today's microprocessors often consume up to 120 watts of power or more. With these microprocessors operating at a 1.2 volt level, 120 watts of power consumption means delivering significant amount of current, up to 100 amps, to these devices. A consequence of this is a requirement to dissipate a great amount of heat. As design advances continue, designs are predicted to approach 200 watts of power consumption in the near future. Successfully delivery of such power to today's and future integrated circuits has become, and will continue to be, a significant challenge.

The factors causing the increase in power consumption are numerous. One such factor is the operating speed of today's designs. Today, core speeds of microprocessors have surpassed 2 GHz. Similarly, bus speeds have increased as well; today's bus speeds have surpassed 400 MHz. As operating frequency increases for a given size integrated circuit, power consumption is also increased. This increase is due to, among other things, parasitic resistance of the motherboard, socket pins and electronic packaging. Unfortunately, the cost to reduce parasitic resistance on motherboards, socket pins and electronic packaging can be extensive. Thus, delivering increased power to today's designs without incurring a significant increase in cost is one challenge facing packaging engineers.

An additional issue facing today's packaging engineers with respect to integrated circuits is coupling associated with higher I/O signal switching speeds and the higher power being delivered to the integrated circuits. In addition to having more power and I/O signals to be delivered/facilitated than previous generations of designs, the desire is to have even smaller packaging of these integrated circuit designs. This is pushing the pins containing the higher speed I/O signals and pins providing increased power delivery closer together in the packaging. This, in turn, is creating further issues between the power delivered to an integrated circuit and the I/O signals entering and leaving the integrated circuit.

Thus, significant challenges face today's packaging engineers with respect to signal I/O and power delivery to today's integrated circuits.

DETAILED DESCRIPTION OF THE PREFERRED EMBODIMENTS

In the following description, various aspects of the invention will be described. However, it will be apparent to those skilled in the art that the invention may be practiced with only some or all aspects of the invention. For purposes of explanation, specific numbers, materials and configurations are set forth in order to provide a thorough understanding of the invention. However, it will also be apparent to one skilled in the art that the invention may be practiced without the specific details. In other instances, well-known features are omitted or simplified in order not to obscure the invention.

The term "flex tape" as used herein is meant to include any flexible substrate material supporting conductors or conductor materials.

The terms "die" and "integrated circuit" as used herein are interchangeable, and are meant to include semiconductor comprising an electronic circuit design.

The terms "power layer" and "ground layer" are meant to imply layers of conductors or conductor materials utilized to provide a reference voltage signal. While generally the term power layer is meant to imply a higher reference level than a ground layer, this is not a requirement. The actual voltage reference level is technology dependant.

The terms metal line, trace, signal trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally aluminum (Al), copper (Cu) or an alloy of Al and Cu, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal suicides are examples of other conductors.

Figure 1:
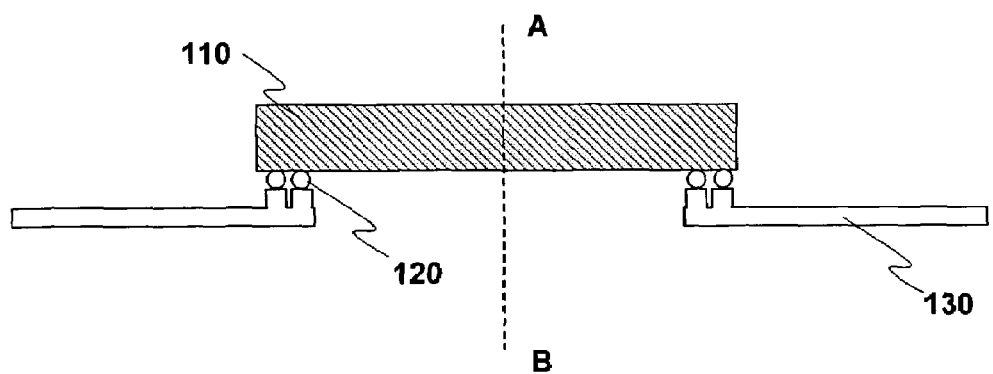
FIG. 1 illustrates one cross sectional view of an integrated circuit packaging scheme using flex tape for signal ingress/egress and power delivery, in accordance with one embodiment.
Figure 2:
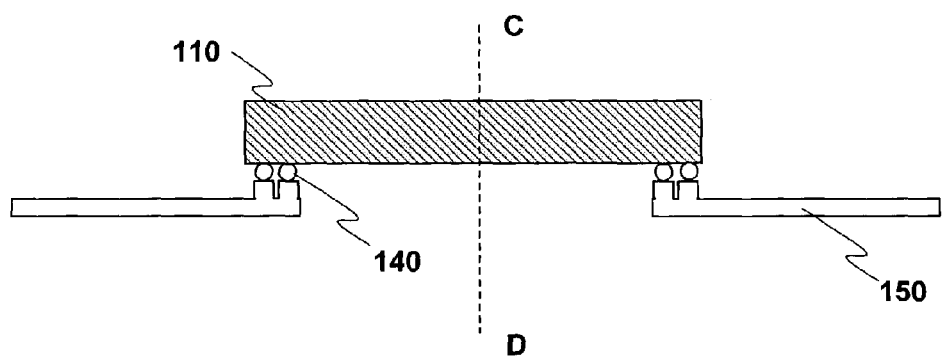
FIG. 2 illustrates a different cross sectional view of the integrated circuit packaging shown in FIG. 1.
Figure 3:
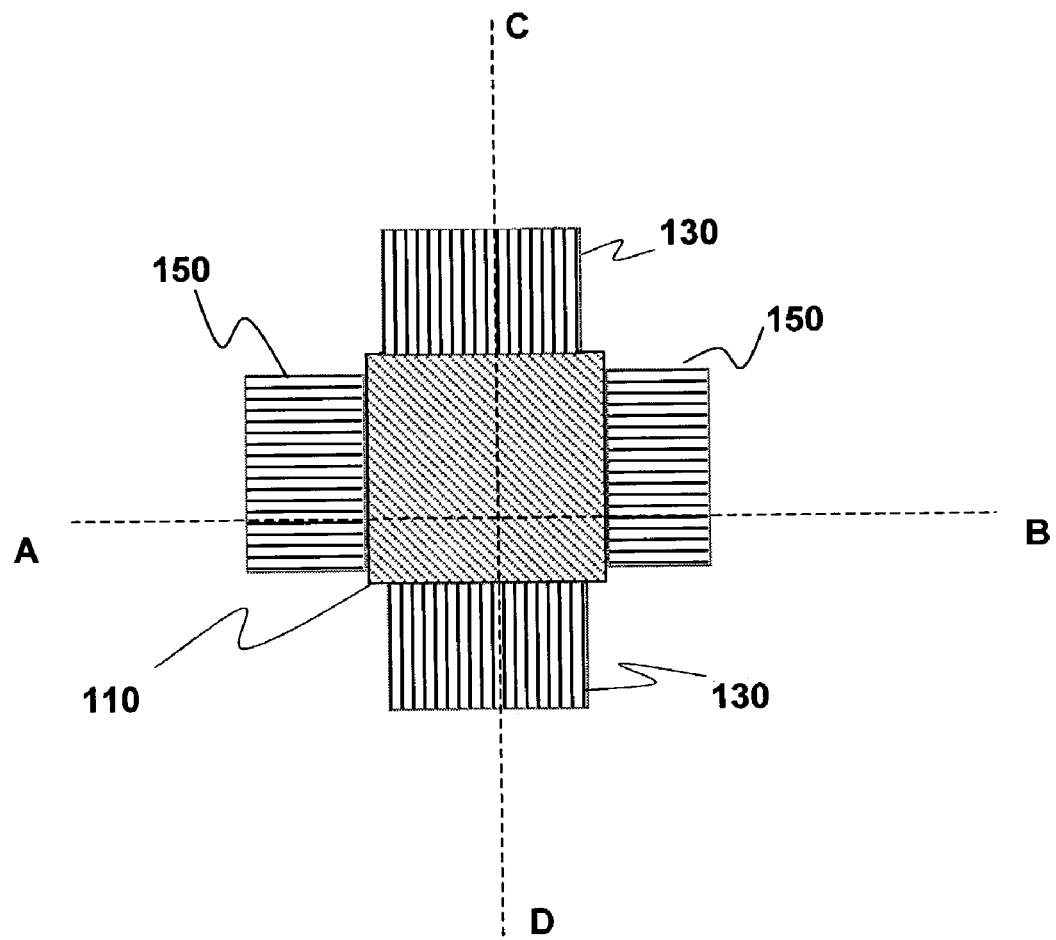
FIG. 3 illustrates a top view of an integrated circuit utilizing flex tape for both power and signal ingress/egress.

FIGS. 1–3 illustrate an integrated circuit packaging scheme using flex tape for signal ingress/egress and power delivery, in accordance with one embodiment. As shown in FIG. 1, a cross sectional view of integrated circuit 110, for the embodiment, integrated circuit 110 has a number of input/output bumps 120 located at the periphery that are used to provide signal ingress/egress to/from integrated circuit 110 through first flex tape 130. Signal ingress/egress may be facilitated e.g. by optical technologies such as optical waveguides or electromechanical technologies. In alternate embodiments, signal ingress/egress may be facilitated via other signaling techniques.

FIG. 2 illustrates a cross sectional view of the integrated circuit packaging shown in FIG. 1. This cross section view is shown with respect to cut line AB of FIG. 1. Periphery integrated circuit bumps 140 are utilized to provide power to the integrated circuit 110 through second flex tape 150.

FIG. 3 illustrates a top view of an integrated circuit utilizing flex tape for both power and signal ingress/egress. The view shown in FIG. 3 illustrates the flexible input/output signal routing substrate, or simply signal flex tape, 130 and the flexible power delivery substrate, or simply power flex tape, 150 of FIGS. 1 and 2, respectively. Integrated circuit 110 is shown with four flex tapes 130 and 150 connected to peripheral signals bumps 120 and peripheral power bumps 140 for the integrated circuit 110. Two signal flex tapes 130 provide signal ingress/egress to the integrated circuit 110. Two power flex tapes 150 are used to provide power delivery to the integrated circuit 110.

In another embodiment, all four flex tapes are used to provide signal ingress and egress to/from and power to the integrated circuit. In this embodiment, peripheral die bumps are used for signal ingress/egress. Die bumps away from the periphery, e.g. internal die bumps, of the die are used for power delivery to the die.

Figure 4:
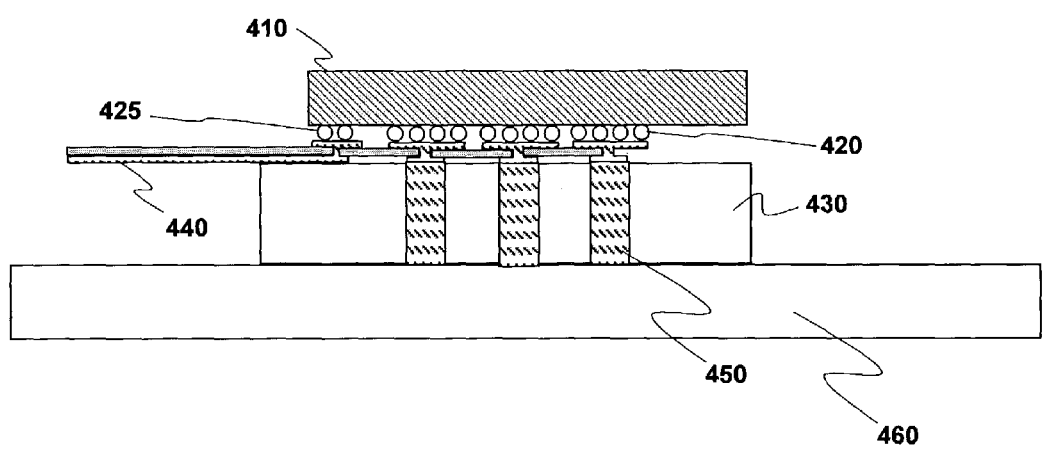
FIG. 4 illustrate power delivery via flex tape, in accordance with another embodiment.

FIG. 4 illustrate power delivery via flex tape, in accordance with another embodiment. As shown, power delivery is provided via multiple paths in this embodiment. Rigid substrate material 430 provides power to integrated circuit 410 from the motherboard 460 through vias 450 to internal die bumps 420. In addition, flex tape material 440 provides power to integrated circuit 410 through periphery die bumps 425.

Figure 5:
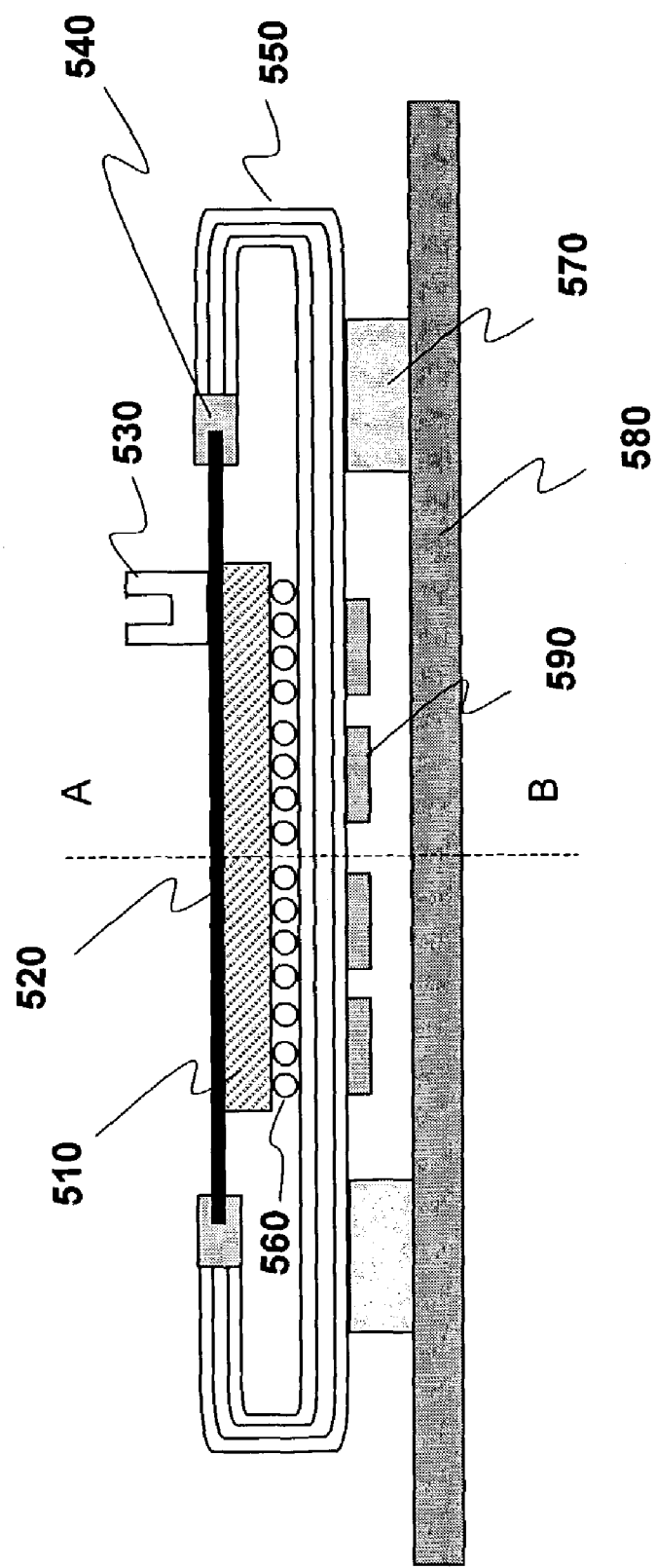
FIG. 5 illustrates power delivery from above through flex tape material, in accordance with one embodiment.

FIG. 5 illustrates power delivery from above through flex tape material, in accordance with one embodiment. Unlike traditional models for delivery of power to an integrated circuit mounted on a motherboard, power delivery to the integrated circuit 510 of FIG. 5 is performed from above. In this case, power is delivered from a power source from above via a connector 530. The power is then routed through a board 520 to the board's edge where the board is connected to connectors 540. The power is delivered through the connectors 540 to flex tape 550. The power is delivered by the flex tape to the integrated circuit 510 via die bumps 560. In this embodiment, the integrated circuit 510 is mounted below the board 520. Also shown are stiffeners 570 that are connected to flex tape 550. In the embodiment shown, these stiffeners 570 are used to provide rigidity to the flex tape 550. The rigidity facilities handling of the package. In addition, the stiffeners 570 provide mount points for the package to be mounted to the motherboard 580. Finally, note that such a design advantageously allows spacing between the flex tape and the motherboard for placement of landside capacitors 590, to be discussed in more detail below.

Figure 6:
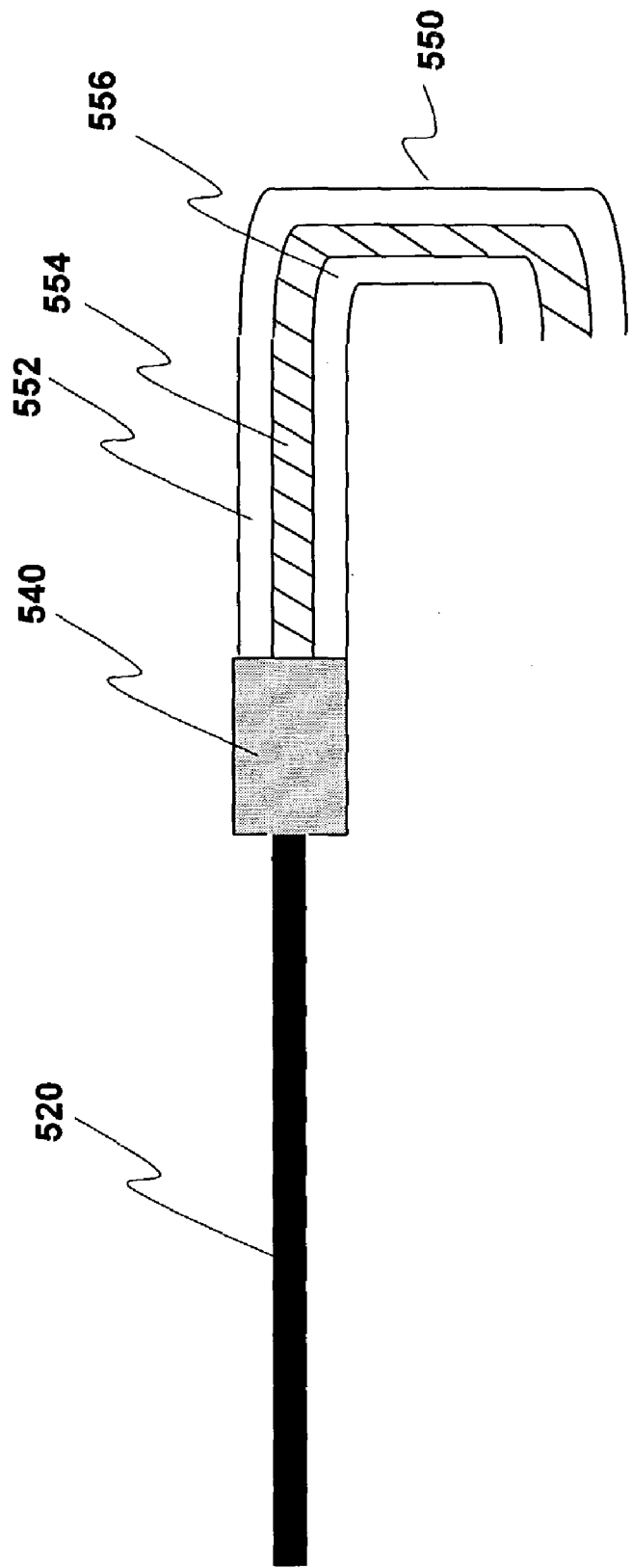
FIG. 6 illustrates a more detailed of the flex tape providing power in FIG. 5.

FIG. 6 illustrates a more detailed view of the flex tape providing power in FIG. 5. In this embodiment, flex tape 550 used to provide power to an integrated circuit is a "two layer" flex tape. As previously discussed, the power is provided via a connector to a board 520. This board provides power to the flex tape 550 through connector 540. In this flex tape architecture, there are two conductive layers 552 556 and a dielectric layer 554. The first conductive layer 552 provides a first reference voltage for the integrated circuit, e.g. Vcc. The second conductive layer 554 provides a second reference voltage for the integrated circuit, e.g. Vss.

Figure 7A:
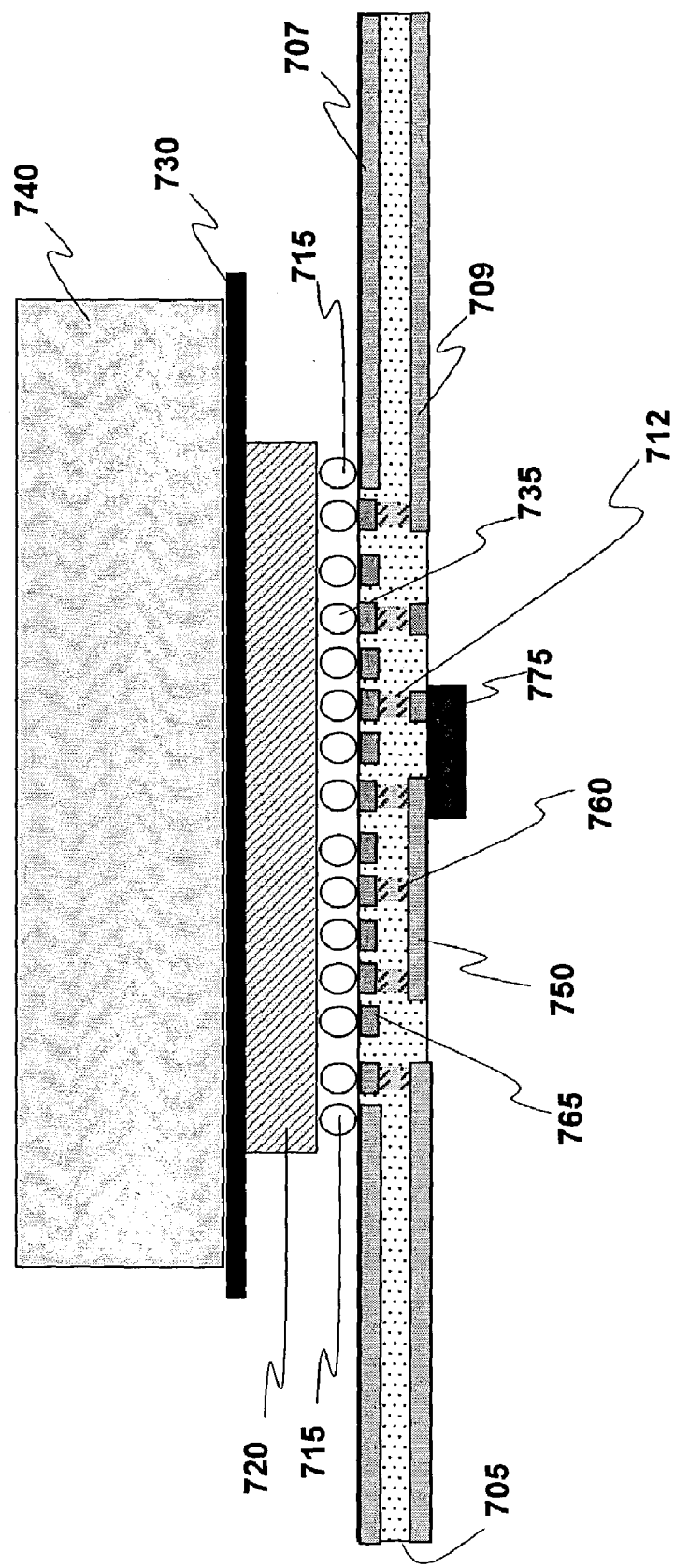
FIGS. 7A and 7B illustrate cross sectional views of integrated circuits, including power delivery to the integrated circuits, in accordance with multiple embodiments.
Figure 7B:
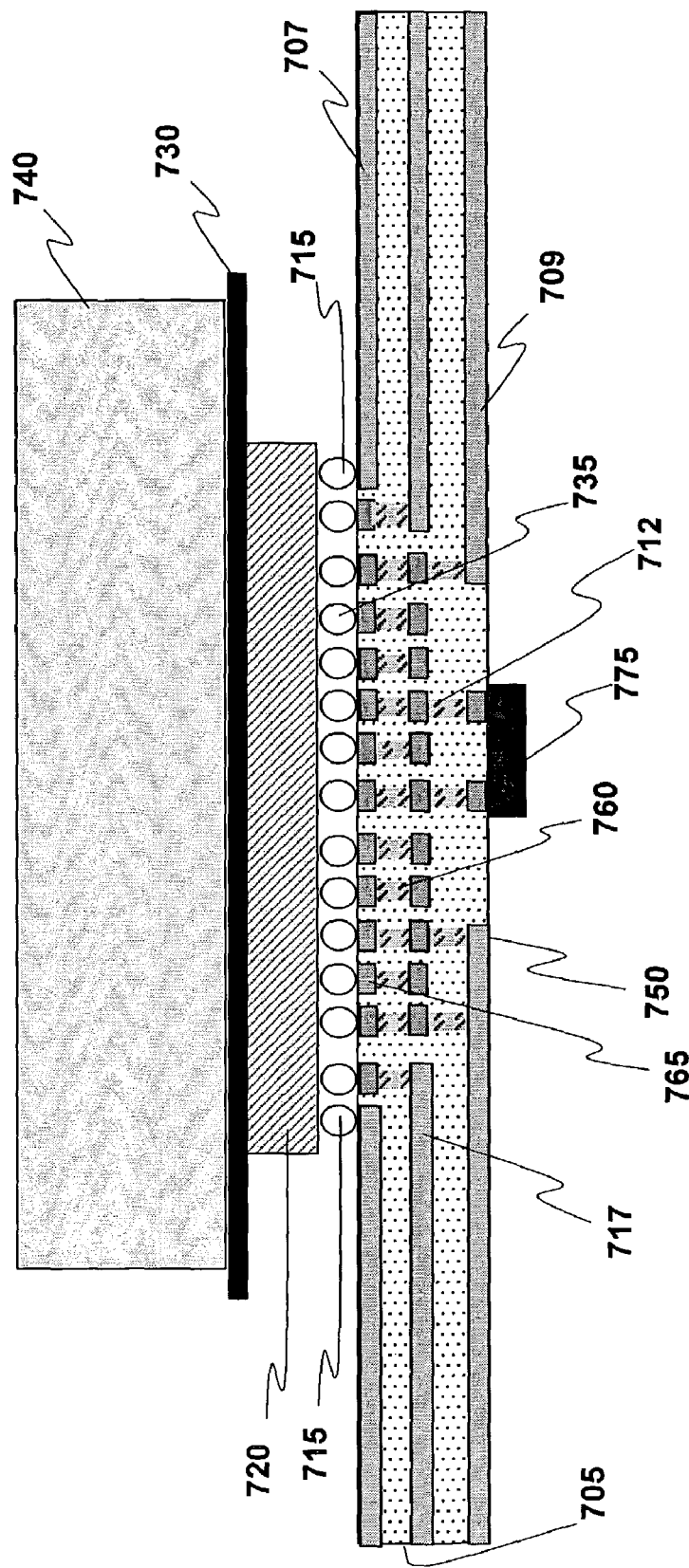

FIGS. 7A and 7B illustrate cross sectional views of integrated circuits, including power delivery to the integrated circuits, in accordance with multiple embodiments. FIG. 7A illustrates an example of a cross section as shown by line AB in the embodiment of FIG. 5. FIG. 7B illustrates a cross section of an embodiment of a three layer flex tape design, described in more detail below. In these embodiments, signal-carrying flex tape 705 is illustrated as extending out from both sides of the integrated circuit 720. In the embodiment illustrated in FIG. 7A, the flex tape has two trace layers, one for carrying signal 707 and one for a signal return path 709. In the embodiment illustrated in FIG. 7B, the flex tape has three traces; one trace 709 for carrying signals and two for signal return paths 707 717.

In the illustrated embodiments, micro vias 712 are utilized to provide access through the flex tape dielectric material. Peripheral bumps 715 are used to provide signal ingress/egress to/from the integrated circuit 720. Interior bumps 735 on the integrated circuit 720 are utilized to provide power to the integrated circuit 720. In these embodiments, as previously discussed with respect to FIG. 5, a board 730 is utilized to provide power to the integrated circuit 720 via flex tape. The integrated circuit 720 is mounted under the power providing board 730.

In the cross sectional view illustrated in FIG. 7A, conductive trace layer 750 is utilized to provide Vss to the integrated circuit 720. Additionally, conductive trace layer 765 is utilized to provide Vcc to integrated circuit 720. In the illustrated embodiment of FIG. 7B, an additional layer is utilized to provide to provide power paths to the integrated circuit 720. Illustrated in FIGS. 7A and 7B are micro vias 760 utilized to provide an access path through the substrate to interior bumps 735 utilized to carry power to integrated circuit 720. Heatsink 740 provides a traditional focus on carrying away excess heat, but also provides a power conduit, such as a voltage regulator module (not shown) to board 730. Landside capacitors 775 are utilized to reduce first and second voltage droop.

In prior art implementations, a rigid substrate, socket and interconnects or power planes in the motherboard were utilized in the packaging of an IC. To enable the use of land side capacitors in such a prior art packaging, the packaging of the IC would need to be larger than otherwise required in order to support the land side capacitors. As illustrated in FIG. 5, the use of a board and flex tape design for power delivery provides room for the design to have land side capacitors without requiring an increase in the overall packaging size.

Figure 8:
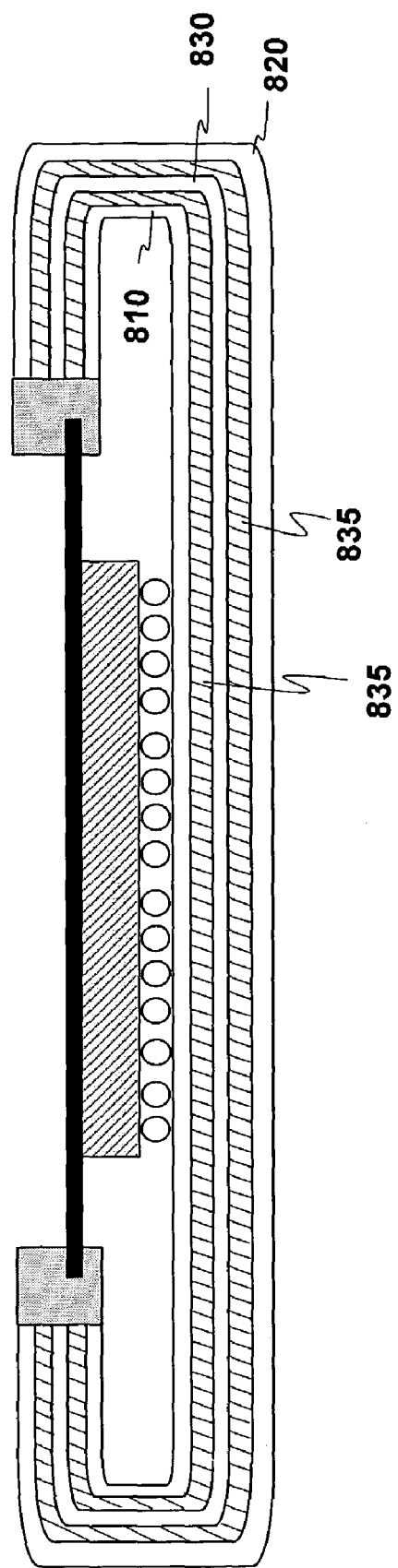
FIG. 8 illustrates a power providing flex tape in accordance with another embodiment.

FIG. 8 illustrates a power providing flex tape in accordance with another embodiment. As illustrated, instead of two reference layers in a two-layer substrate, an additional reference layer is advantageously provided. As will be appreciated, the flex tape will have certain parasitic inductance and/or resistances associated with it. As a result of these factors, depending on the power deliver requirements, a two-layer power deliver flex tape may not be sufficient. In such as case, a three-layer power deliver flex tape, comprising a third reference layer, may be used to provide power to an integrated circuit. For example, as illustrated in FIG. 8, an inner reference layer 810 and an outer reference layer 820 are power providing reference layers. A middle reference layer 830 is utilized as a ground reference layer. Between layers of reference signal layers are layers of dielectric materials 835. By having an additional reference layer to provide power to the integrated circuit, effects of parasitics can be minimized.

When separating flex tapes for power and ground from flex tapes for signaling, dielectrics may be optimized for the particular usage. As discussed in further detail below, when high speed signaling is to be accommodated on signal traces in flex tape, it is desirable to have a low dielectric constant, low loss dielectric material. The expression, low dielectric constant material, refers to materials having a lower dielectric constant than silicon dioxide. However, when power is to be supplied by a flex tape that will not also have signal traces, the dielectric material may be optimized for the power delivery. Thus, in this power delivery flex tape, high dielectric constant materials may be used between power and ground traces for improved power delivery. Examples of high dielectric constant materials include titanium dioxide with a dielectric constant of 110.

Figure 9:
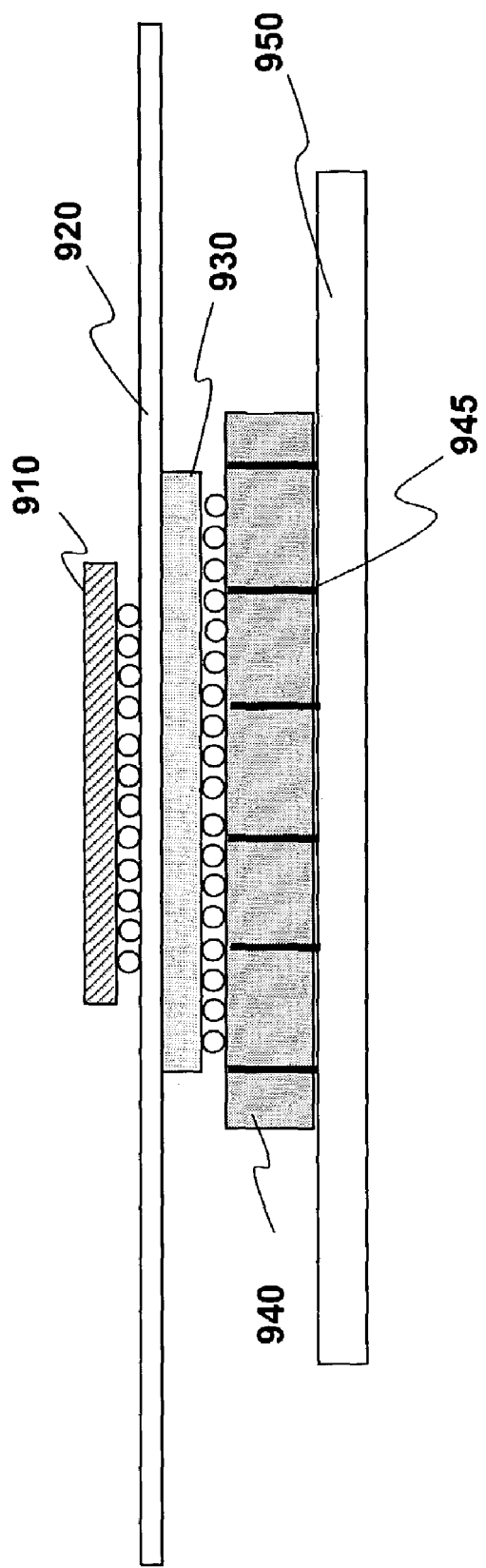
FIG. 9 illustrates flex tape enabled signal ingress/egress in a Silicon Building Block (SiBB) design.

FIG. 9 illustrates flex tape enabled signal ingress/egress in a Silicon Building Block (SiBB) design. In this embodiment, an integrated circuit 910 utilizes flex tape 920 for the ingress/egress of signals to the integrated circuit 910. In this embodiment, power is delivered to the integrated circuit from the bottom via a motherboard 950. Rigid substrate 940 provides power delivery pathways 945 for the delivery of power to the integrated circuit 910. In this embodiment, the substrate 940 may contain a relatively simplified power routing design. Thus, substrate 940 may be made up of a low cost substrate material such as plastic. This simplified, inexpensive power routing design is possible because of silicon interposer 930. Silicon interposer 930 provides the ability to move detailed power delivery routing issues from substrate 940 to the silicon interposer 930.

Power delivery substrates are designed to take into account inductance, resistance and capacitance effects in routing power from a power source to power bumps. This allows for maximum power transfer with minimum loss. The detailed aspects of creating and manufacturing a well-designed substrate for today's designs, drive the cost up dramatically. Thus, today's substrates can cost up to as much as that of the integrated circuit designs.

If a manufacturer of integrated circuits could utilize internal expertise in silicon to create a silicon interposer that performs these critical power deliver design tasks, the resulting substrate cost can be reduced dramatically. For example, a manufacturer of an integrated circuit may have particularly strong skills in silicon processing. In addition, the manufacturer that may have access to older generation silicon manufacturing equipment that, while outdated by the standards of today's leading edge integrated circuit processing, is available for other uses. This equipment and expertise can be utilized to create a silicon interposer at greatly reduced costs as compared to a substrate. Thus, by using an interposer design for power delivery, combined with flex tape enable I/O signaling, significant reductions in the manufacturing costs can be obtained.

Figure 10:
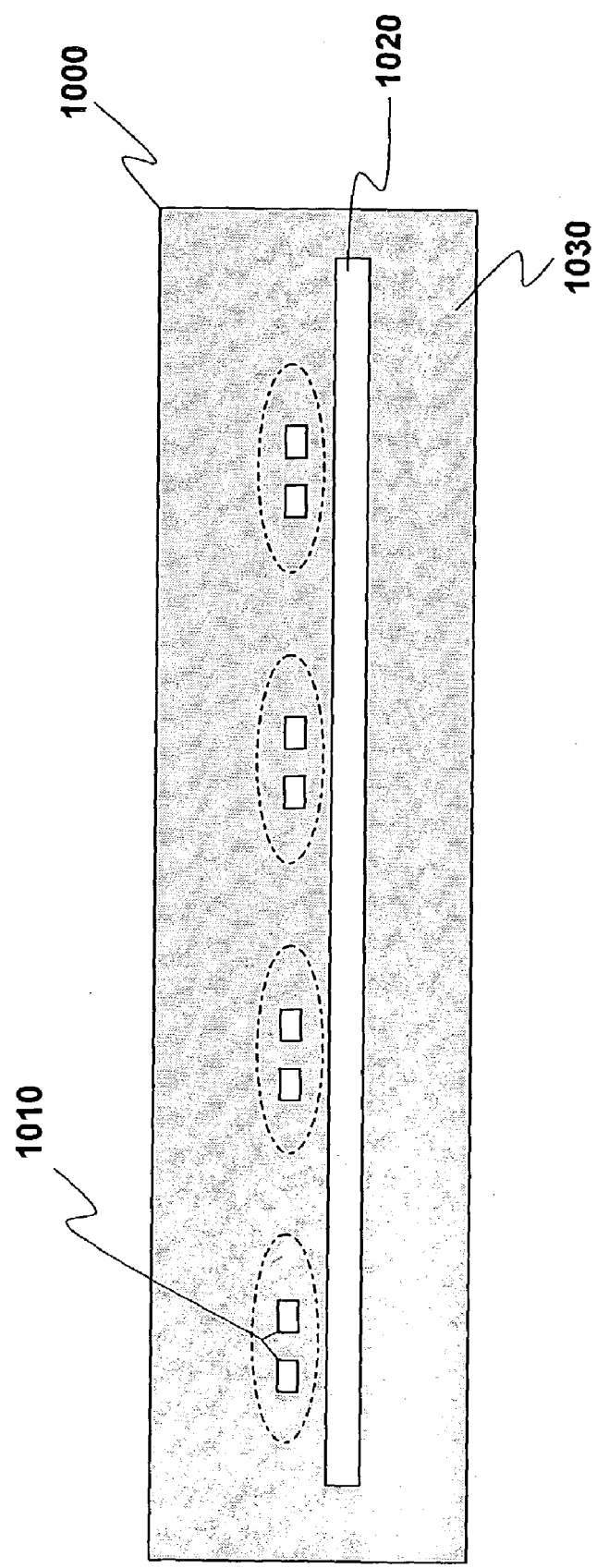
FIG. 10 illustrates an architecture for a flex tape for signal delivery, in accordance with one embodiment.

FIG. 10 illustrates an architecture for flex tape for signal delivery, in accordance with one embodiment. In this embodiment, differential signaling is used to provide for high-speed operation of signal ingress and egress to/from integrated circuits. Flex tape 1000 contains traces 1010 for differential signal routing. In the embodiment shown in FIG. 10, a ground layer 1020 is introduced into the flex tape. Differential signaling, especially in low voltage applications which are possible due to differential signaling noise immunity, provides a number of advantages over single-ended signaling. Such advantages, in addition to noise immunity, include reduced electromagnetic interference, improvements in switching speeds and reduction in power consumption. An example of differential signaling is Low Voltage Differential Signaling, which uses a 400 mV differential signal at 1.2V. The ground layer 1020 provides for improved coupling to further improve performance of the differential signals.

Differential signaling is utilized when high speed signaling is required. To further facilitate high speed signaling, dielectric materials should be used which possess low-loss and low-k, k being the average dielectric constant of the material. A low-k material would be a material with a dielectric constant less then 3. A low-loss material would have a loss tangent of less than 0.01. Examples of such materials are polyimides.

Figure 11:
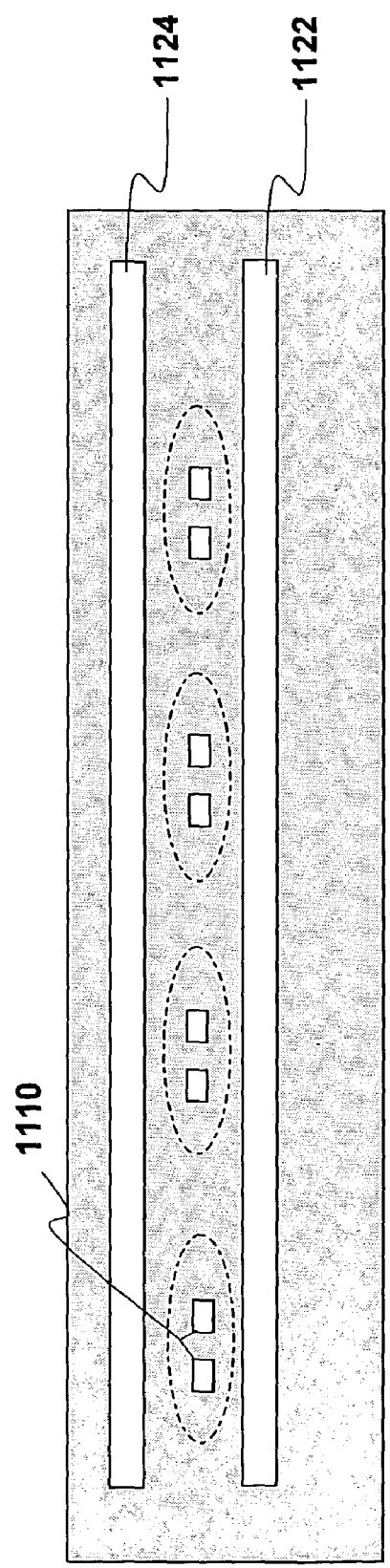
FIG. 11 illustrates a flex tape signaling design in accordance with another embodiment.

FIG. 11 illustrates a flex tape signaling design in accordance with another embodiment. In addition to traces 1110 designed for differential pair signaling and a reference, e.g. ground, layer 1122, this embodiment of flex tape illustrates a second reference layer 1124. The addition of this second reference layer 1124 provides additional shielding. This added shielding provides for enhanced noise immunity.

Figure 12:
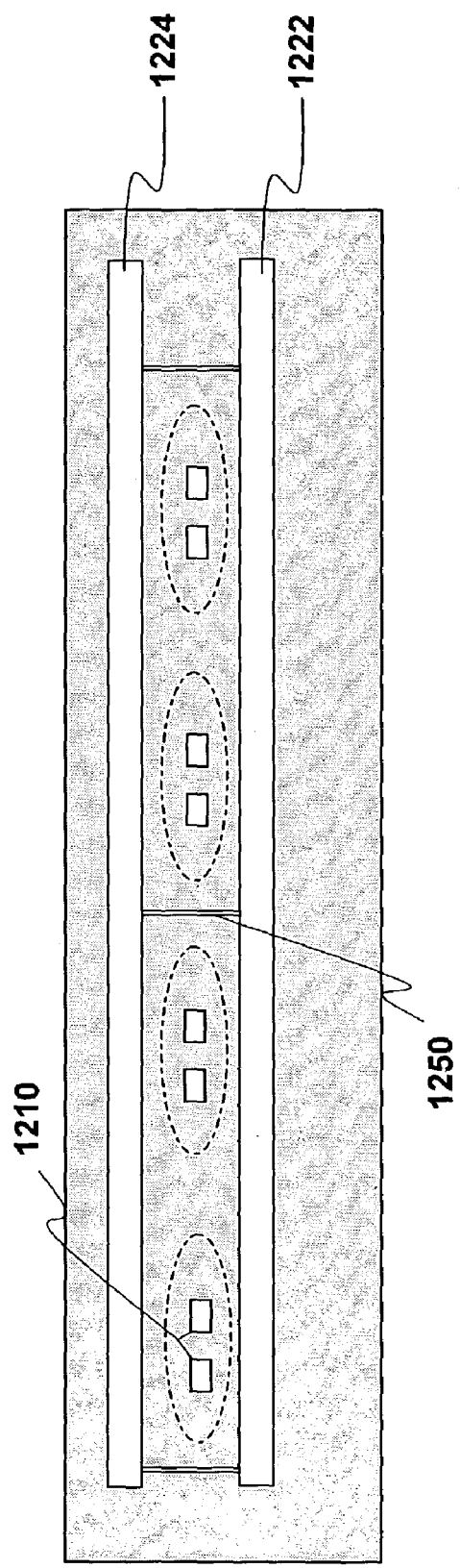
FIG. 12 illustrates a flex tape signaling design in accordance with yet another embodiment.

FIG. 12 illustrates a flex tape signaling design in accordance with yet another embodiment. This design utilizes traces 1210 for differential signals and two references layers 1222 1224. In addition, this design electrically couples (e.g. stitches) the ground layers 1222 1224 together at intervals. In one embodiment, ground layers 1222 1224 are stitched together utilizing stitching vias 1250. The number of stitching vias 1250 present in a design can vary. In one embodiment, the ground layers 1222 1224 are stitched together after every two sets of differential signaling pairs 1210. The use of stitching ground layers results in, among other things, better electromagnetic interference shielding.

Figure 13:
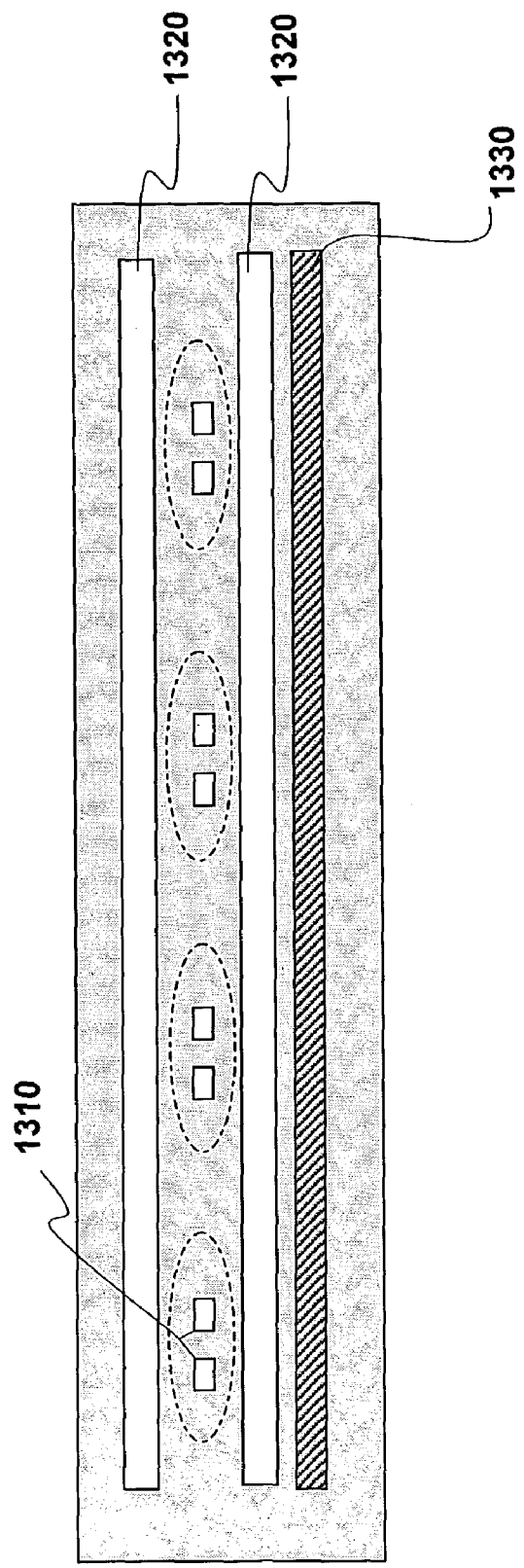
FIG. 13 illustrates a flex tape signaling design that additionally provides power, in accordance with one embodiment.

FIG. 13 illustrates a flex tape signaling design that additionally provides power, in accordance with one embodiment. Traces for carrying differential signals 1310 are illustrated. As previously discussed, these traces provide high-speed ingress and egress to/from an integrated circuit. Ground layers 1320 provide shielding and coupling to allow improved operational speed of signals utilizing these traces. Additionally, in this embodiment, power layer 1330 is provided. Power layer 1330 provides power to an integrated circuit. Referring again briefly to FIG. 3, recall that in the embodiment shown there, four flex tapes are used to provide signals and power to the design. As described in relationship to FIG. 3, two flex tapes provides signal ingress/egress and two flex tapes provide power. In another usage model for four flex tapes, each flex tape contains a design as shown in FIG. 13. By using the flex tape design of FIG. 13, each of the four flex tapes can provide signal ingress/egress. This allows for a potential of up to twice as many signal I/Os to be routing using the flex tapes in designs with very high I/O signal count. In addition, the flex tape design of FIG. 13 provides addition sources for power delivery to an integrated circuit. Utilizing the flex tape embodiment of FIG. 13, all four flex tapes can also be used to provide power to an integrated circuit.

Figure 14:
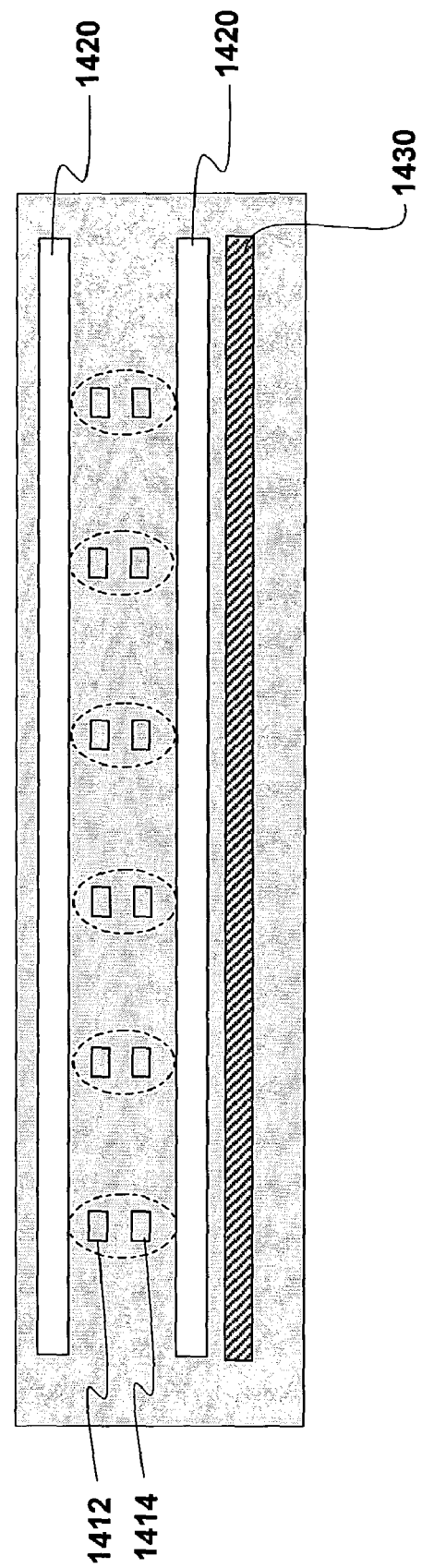
FIG. 14 illustrates a flex tape architecture in accordance with another embodiment.

FIG. 14 illustrates a flex tape architecture in accordance with another embodiment. In this embodiment, as illustrated before, traces for carrying differential signals 1412 1414 are used in the flex tape design. These traces are located between two ground layers 1420 to provide for better reference and electromagnetic interference shielding. Instead of the traces for two differential signals being arranged horizontally between the two ground layers 1420 as in the previous embodiments, the two traces 1412 1414 are arranged vertically. This vertical orientation allows for greater coupling effect between two differential signals routed on the two traces, further reducing the signals' susceptibility to noise.

Figure 15:
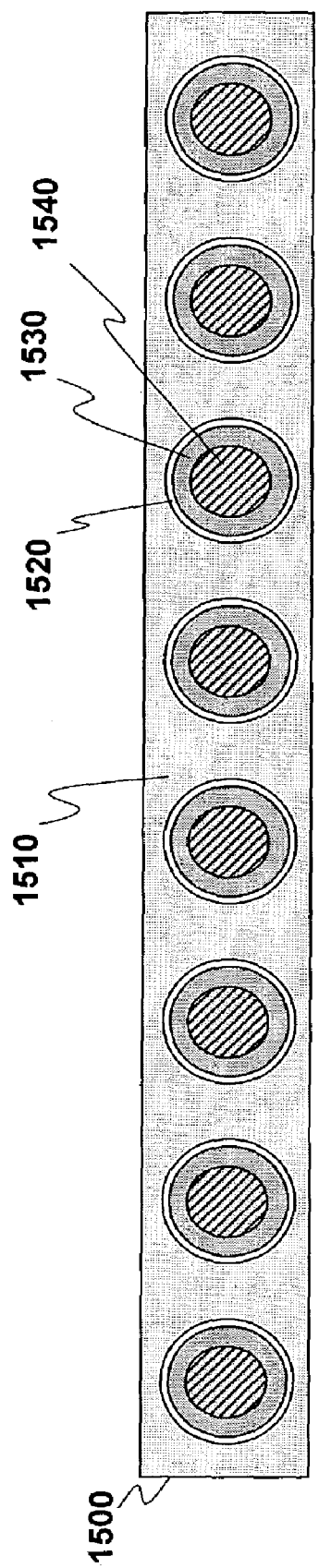
FIG. 15 illustrates a coaxial design for signals in flex tape, in accordance with one embodiment.

FIG. 15 illustrates a coaxial design for signals in flex tape 1500, in accordance with one embodiment. Traditionally rigid substrates have not allowed for the design of signals in a coaxial pattern. However with the use of a substrate comprised of flexible materials, propagating signals using a coaxial conductive set is practical. Thus, in the flex tape embodiment show in FIG. 15, a conductive core 1540 provides propagation path for a signal. Outside the conductive core 1540 is a dielectric layer 1530. Outside the dielectric layer 1530 is a signal return path, via a reference layer 1520. The signal core 1530 and reference layer 1520 are positioned inside a flexible substrate 1510. Propagating signals using coaxial cable flex tapes reduces insertion loss and return loss associated with current I/O designs, while enhancing impedance control. In another embodiment, the conductive core comprises two wires and insulation, forming a twisted pair. In this embodiment, differential signaling is used in the propagation of the signal inside a coaxial design. This further improves noise immunity.

Figure 16:
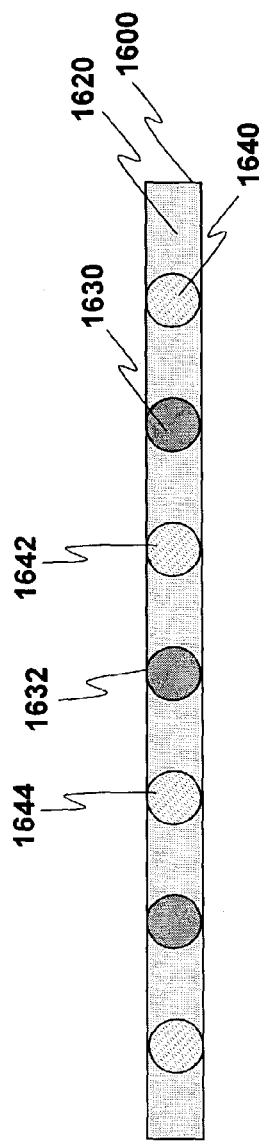
FIG. 16 illustrates a coplanar waveguide design for signal traces in a flex tape, in accordance with one embodiment.

FIG. 16 illustrates a coplanar waveguide design 1600 for signal traces in a flex tape, in accordance with one embodiment. In the illustrated coplanar wave guide structure, single ended signals traces 1630–1632 are placed between reference traces 1640–1644, e.g. ground. Both signal traces 1630–1632 and ground traces 1640–1644 are in flexible substrate material 1620. Two references surrounding a signal trace defining a set of coplanar waveguide signal traces. In the embodiment shown, adjacent sets of coplanar waveguide signal traces share a common reference signal trace. For example, one set of coplanar waveguide signal traces is made up of two references traces 1640 1642 and a signal trace 1630. An adjacent set of coplanar waveguide signal traces is made up of two references traces 1642 1644 and a signal trace 1632. These two sets share a reference trace 1642.

The coplanar waveguide design, and grounded coplanar waveguide design described below, reduces insertion and return loss associated with current I/O designs. In addition, coplanar waveguide designs significantly reduce the crosstalk between signals.

Figure 17:
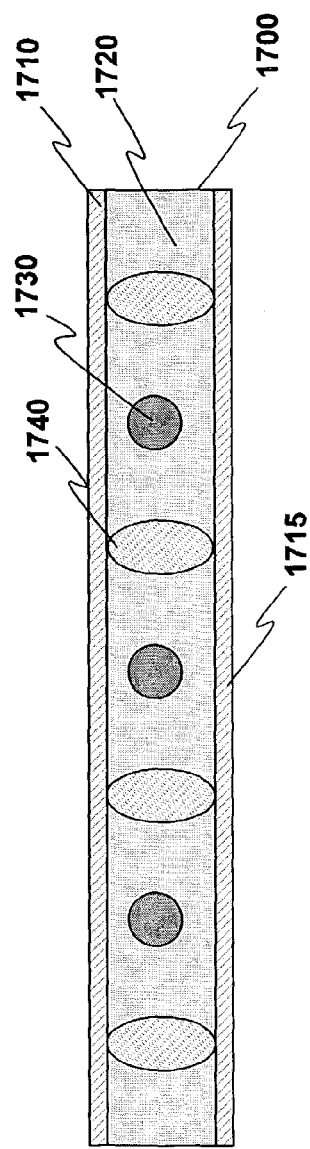
FIG. 17 illustrates a grounded coplanar waveguide design for signal traces in a flex tape, in accordance with one embodiment.

FIG. 17 illustrates a grounded coplanar waveguide design 1700 for signal traces in a flex tape, in accordance with one embodiment. In addition to single ended signals traces 1730 being placed between grounds traces 1740 as with the coplanar waveguide design of FIG. 16, in this embodiment ground layers 1710 1715 are used. Ground layers 1710 1715 are used to improve electromagnetic shielding of signals. In the embodiment illustrated, an upper ground layer 1710 and a lower ground layer 1715 are shown.

Thus a novel architecture for delivery of power to an integrated circuit is disclosed.

What is claimed is:

1. An apparatus comprising:
a core substrate;
an interposer upon said core substrate;
a flexible substrate upon said interposer, said flexible substrate having a signal return path coaxial to an insulated conductive core, said flexible substrate being capable of I/O (input/output) signal routing; and
an integrated circuit upon said flexible substrate, said integrated circuit communicatively coupled with said signal return path and said conductive core.

2. The apparatus of claim 1 wherein said interposer comprises a silicon interposer.

3. The apparatus of claim 1 wherein said interposer and said core substrate comprise power pathways to said integrated circuit.

4. The apparatus of claim 1 wherein said core substrate comprises a plastic substrate.

5. The apparatus of claim 1 wherein said conductive core comprises a pair of wires and insulation forming a twisted pair.

6. The apparatus of claim 1 wherein said flexible substrate comprises a dielectric material, said dielectric material comprising a loss tangent less than 0.01 including a dielectric constant less than 3.

7. The apparatus of claim 1 wherein said flexible substrate comprises polyimide.

8. The apparatus of claim 1 wherein said flexible substrate comprises copper traces.

9. The apparatus of claim 1 wherein said interposer comprises a dielectric material.

10. The apparatus of claim 9 wherein said dielectric material comprises a dielectric constant greater than 100.

* * * * *

UNITED STATES PATENT AND TRADEMARK OFFICE
CERTIFICATE OF CORRECTION

| | | |
|---|---|---|
| PATENT NO. | : 6,995,465 B2 | Page 1 of 1 |
| APPLICATION NO. | : 10/455908 | |
| DATED | : February 7, 2006 | |
| INVENTOR(S) | : Dong Zhong et al. | |

It is certified that error appears in the above-identified patent and that said Letters Patent is hereby corrected as shown below:

Figure 10
Reference number 1030 should be deleted.

Figure 14
Reference number 1430 should be deleted.

Figure 17
Reference number 1720 should be deleted.

Column 4
Lines 17, "...second conductive layer 554..." should read --...second conductive layer 556...--.

Column 6
Line 47, "...signaling pairs 1210..." should read --...signaling pairs transmitted through the traces 1210...--.

Column 7
Line 28, "...signal core 1530..." should read --...signal core 1540...--.
Line 39, "...signals traces..." should read --...signal traces...--.

Signed and Sealed this

Twenty-seventh Day of March, 2007

JON W. DUDAS
*Director of the United States Patent and Trademark Office*